United States Patent
Kuechenmeister et al.

(10) Patent No.: US 8,580,672 B2
(45) Date of Patent: Nov. 12, 2013

(54) METHODS OF FORMING BUMP STRUCTURES THAT INCLUDE A PROTECTION LAYER

(75) Inventors: Frank Kuechenmeister, Dresden (DE); Lothar Lehmann, Radebeul (DE); Alexander Platz, Ebersbach (DE); Gotthard Jungnickel, Radeberg (DE); Sven Kosgalwies, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/280,881

(22) Filed: Oct. 25, 2011

(65) Prior Publication Data

US 2013/0099372 A1    Apr. 25, 2013

(51) Int. Cl.
*H01L 21/44*    (2006.01)

(52) U.S. Cl.
USPC 438/613; 257/737; 257/E23.07; 257/E21.295; 438/614

(58) Field of Classification Search
USPC .......... 257/773, 779, 780, E23.068; 438/106, 438/625, 687, 613, 666
See application file for complete search history.

(56) References Cited

U.S. PATENT DOCUMENTS

| | | | |
|---|---|---|---|
| 3,956,043 A | | 5/1976 | Zahir et al. |
| 6,108,212 A | | 8/2000 | Lach et al. |
| 6,737,295 B2 | | 5/2004 | Pendse et al. |
| 6,958,546 B2 * | 10/2005 | Fan et al. | 257/773 |
| 7,331,106 B2 | | 2/2008 | Workman et al. |
| 7,888,714 B2 | | 2/2011 | Takahashi et al. |
| 8,129,267 B2 * | 3/2012 | Cabral et al. | 438/625 |
| 8,283,247 B2 | | 10/2012 | Lehr et al. | 438/614 |
| 2004/0235220 A1 | 11/2004 | Maeda | 438/106 |
| 2006/0170102 A1 * | 8/2006 | Ko | 257/738 |
| 2007/0085224 A1 * | 4/2007 | Kouno et al. | 257/791 |
| 2009/0127710 A1 * | 5/2009 | Daubenspeck et al. | 257/737 |
| 2011/0006421 A1 * | 1/2011 | Daubenspeck et al. | 257/737 |
| 2012/0211900 A1 * | 8/2012 | Choi et al. | 257/782 |

FOREIGN PATENT DOCUMENTS

DE    102007057689 A1    6/2009    ............. H01L 21/60

OTHER PUBLICATIONS

Translation of Official Communication from German Patent Office for German Patent Application No. 10 2012 219 330.8 dated Jun. 25, 2013.

* cited by examiner

*Primary Examiner* — Steven Loke
*Assistant Examiner* — David Goodwin
(74) *Attorney, Agent, or Firm* — Williams, Morgan & Amerson, P.C.

(57) ABSTRACT

One illustrative method disclosed herein includes forming a conductive pad in a layer of insulating material, forming a passivation layer above the conductive pad, performing at least one etching process on the passivation layer to define an opening in the passivation layer that exposes at least a portion of the conductive pad, forming a protective layer on the passivation layer, in the opening and on the exposed portion of the conductive pad, forming a heat-curable material layer above the protective layer, performing an etching process to define a patterned heat-curable material layer having an opening that exposes a portion of the protective layer, performing an etching process on the protective layer to thereby expose at least a portion of the conductive pad and forming a conductive bump that is conductively coupled to the conductive pad.

15 Claims, 7 Drawing Sheets

US 8,580,672 B2

METHODS OF FORMING BUMP STRUCTURES THAT INCLUDE A PROTECTION LAYER

BACKGROUND OF THE INVENTION

1. Field of the Invention

Generally, the present disclosure relates to the manufacturing of sophisticated semiconductor devices, and, more specifically, to various methods of forming conductive bump structures on integrated circuit devices and devices comprising such structures.

2. Description of the Related Art

In the manufacture of modern integrated circuits, it is usually necessary to provide electrical connections between the various semiconductor chips making up a microelectronic device. Depending on the type of chip and the overall device design requirements, these electrical connections may be accomplished in a variety of ways, such as, for example, by wire bonding, tape automated bonding (TAB), flip-chip bonding, and the like. In recent years, the use of flip-chip technology, wherein semiconductor chips are attached to substrates, carriers, or other chips by means of solder balls formed from so-called solder bumps, has become an important aspect of the semiconductor processing industry. In flip-chip technology, solders balls are formed on a contact layer of at least one of the chips that is to be connected, such as, for example, on a dielectric passivation layer formed above the last metallization layer of a semiconductor chip comprising a plurality of integrated circuits. Similarly, adequately sized and appropriately located bond pads are formed on another chip, such as, for example, a carrier package, each of which corresponds to a respective solder ball formed on the semiconductor chip. The two units, i.e., the semiconductor chip and carrier package, are then electrically connected by "flipping" the semiconductor chip and bringing the solder balls into physical contact with the bond pads, and performing a "reflow" process so that each solder ball bonds to a corresponding bond pad. Typically, hundreds, or even thousands, of solder bumps may be distributed over the entire chip area, thereby providing, for example, the I/O capability required for modern semiconductor chips that usually include complex circuitry, such as microprocessors, storage circuits, three-dimensional (3D) chips, and the like, and/or a plurality of integrated circuits forming a complete complex circuit system.

FIGS. 1A-1F depict one illustrative prior art process flow for forming conductive bumps for a semiconductor device. FIG. 1A depicts an illustrative prior art device 100 at an early stage of manufacture. As shown therein, a plurality of conductive pads 12 are formed in a layer of insulating material 10. An illustrative passivation layer 14 is formed above the layer of insulating materials. In one illustrative example, the passivation layer 14 may be comprised of multiple layers of material. More specifically, in the depicted example, the passivation layer 14 may be comprised of a layer of silicon-carbon-nitride (BLOK) 14A having an illustrative thickness of about 100 nm, a layer of silicon dioxide 14B having an illustrative thickness of about 450 nm and a layer of silicon nitride having an illustrative thickness of about 400 nm. The layers 14A, 14B and 14C may be formed using traditional deposition processes, such as chemical vapor deposition (CVD) processes.

Next, as shown in FIG. 1B, openings 16 are formed in the passivation layer 14 to thereby expose portions of the conductive pads 12. The openings 16 may be formed using traditional photolithography and etching processes. More specifically, one or more etching processes are performed through a patterned photoresist mask (not shown) to form the openings 16. The size of the openings may vary depending upon the particular application.

Next, as shown in FIG. 1C, a polyimide layer 18 is formed. The polyimide layer 18 is typically formed by initially depositing the polyimide material using a spin-coating technique, and thereafter performing a heating process at a temperature of, for example, about 360° C., to cure the polyimide layer 18. In some case, the polyimide layer 18 may have a thickness of about 2-10 microns. Unfortunately, during the process of forming the polyimide layer 18, oxide material 19, e.g., copper oxide, forms at the interface between the polyimide layer 18 and the conductive pad 12. It should be noted that, although the oxide material 19 is depicted as being a uniform layer, in practice the oxidation may not be so uniformly distributed across the conductive pad 12. The presence of such oxide material 19 may tend to locally increase the resistance between the conductive pad 12 and the conductive bump that will be formed above the conductive pad 12. Such increased resistance may reduce the performance capabilities of the resulting semiconductor device.

FIG. 1D depicts the device 100 after several process operations have been performed. First, the polyimide layer 18 has been patterned using known photolithography and etching techniques. More specifically, one or more etching processes are performed through a patterned photoresist mask (not shown) formed above the polyimide layer 18 to form the patterned polyimide layer 18 depicted in FIG. 1D. Then, an under-bump metallization (UBM) layer 20 is blanket-deposited across the device 100. The UBM layer 20 may be comprised of multiple layers of material and it may be formed by performing one or more deposition processes. In one example, the UBM layer 20 may be comprised of an initial layer of titanium and a second layer of copper.

Then, as shown in FIG. 1E, a patterned mask layer 22, e.g., a photoresist mask, is formed above the device 100 and conductive material 24 for the conductive bump is formed on the device 100. In one illustrative example, a plating process is performed to form a layer of nickel (not shown) on the exposed portions of the device followed by another playing process that forms the bulk of the conductive material 24. In one illustrative example, the conductive material 24 is comprised of tin-silver, but other materials may also be used.

FIG. 1F depicts the device 100 after additional process operations have been performed. Initially, the patterned mask layer 22 (see FIG. 1E) is removed. Thereafter, a heating or reflow process is performed which results in the formation of the illustrative conductive bumps 24B shown in FIG. 1F.

The present disclosure is directed to various methods of forming conductive bumps on a semiconductor device that may at least reduce or eliminate one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming conductive bump structures on integrated circuit devices, wherein, in some embodiments, a protective layer is employed, and devices comprising such structures. In one example, the method includes forming a conductive pad in a layer of insulating material, forming a passivation layer above the conductive pad and the layer of insulating material, performing at least one etching process on the passivation layer to define an opening in the passivation layer that exposes at least a portion of the conductive pad and forming a protective layer on the passivation layer, in the opening and on the exposed portion of said conductive pad. In this example the method further includes the steps of forming a heat-curable material layer (such as a polyimide layer or a PBO layer) above the protective layer, performing an etching process on the heat-curable material layer to define a patterned heat-curable material layer having an opening that exposes a portion of the protective layer, performing an etching process to remove the exposed portion of the protective layer to thereby expose at least a portion of the conductive pad and, after removing the exposed portion of the protective layer, forming a conductive bump that is conductively coupled to the conductive pad.

In one illustrative embodiment, a device disclosed herein includes first and second spaced-apart conductive pads positioned in a layer of insulating material, first and second under-bump metallization layers that are conductively coupled to the first and second conductive pads, respectively, and first and second spaced-apart conductive bumps, each of which are conductively coupled to the first and second under-bump metallization layers, respectively. In this example, the device further includes a passivation layer positioned above the layer of insulating material between the first and second spaced-apart conductive bumps and a protective layer positioned on the layer of insulating material, wherein the protective layer extends between and contacts the first and second under-bump metallization layers.

Another illustrative method disclosed herein includes forming a conductive pad in a layer of insulating material, forming a multi-layer passivation layer above the conductive pad and above the layer of insulating material, wherein a first layer of the multi-layer passivation layer is in contact with the conductive pad and the layer of insulating material, performing at least one etching process on the multi-layer passivation layer to remove at least one layer of the multi-layer passivation layer, to thereby define an etched passivation layer having a recess that exposes at least a portion of the first layer and forming a heat-curable material layer above the etched passivation layer and the exposed portion of said first layer. In this example, the method further includes performing an etching process on the heat-curable material layer to define a patterned heat-curable material layer having an opening that exposes a portion of the etched passivation layer and the exposed portion of the first layer, performing an etching process to remove the exposed portion of the first layer to thereby expose at least a portion of the conductive pad and after removing the exposed portion of the first layer, forming a conductive bump that is conductively coupled to the conductive pad.

BRIEF DESCRIPTION OF THE DRAWINGS

The disclosure may be understood by reference to the following description taken in conjunction with the accompanying drawings, in which like reference numerals identify like elements, and in which.

Figure 1A:
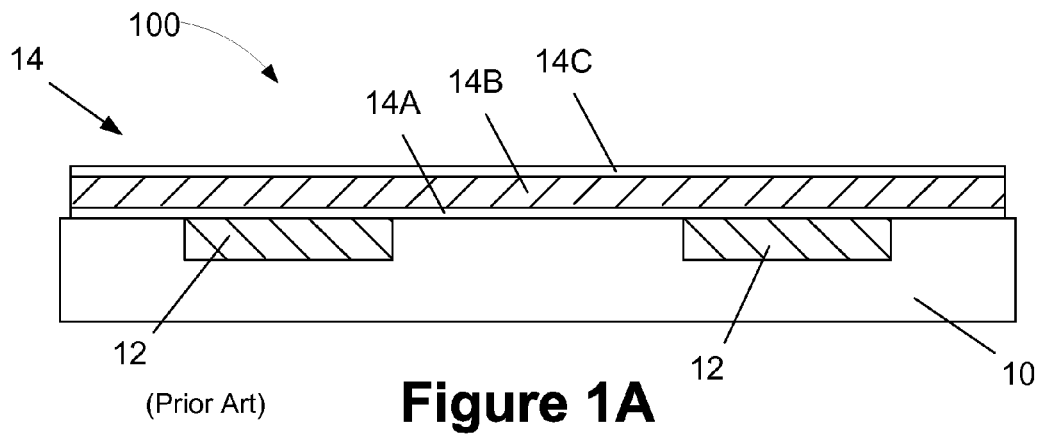
FIG. 1A-1F depict one illustrative prior art technique employed to form bump structures on an integrated circuit device.
Figure 1B:
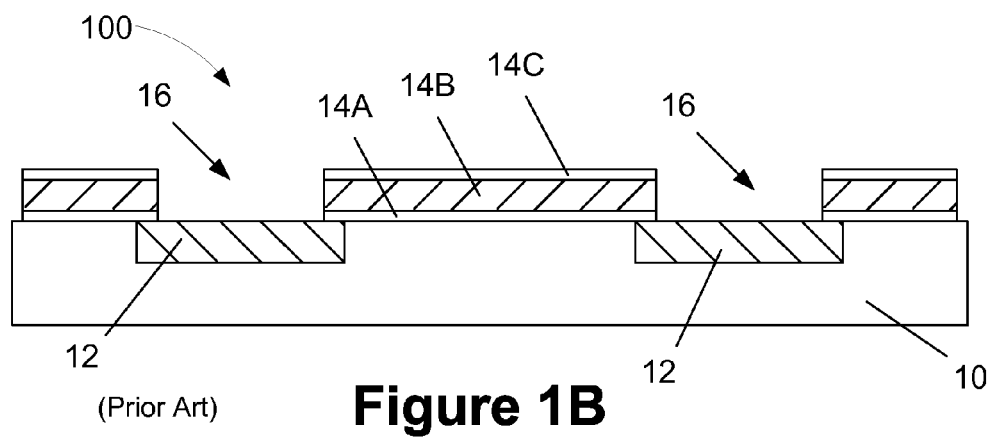
Figure 1C:
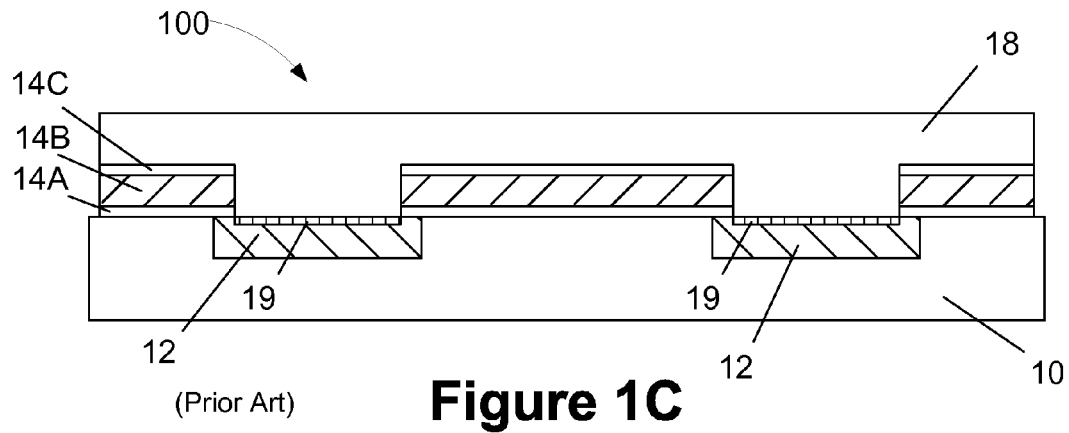
Figure 1D:
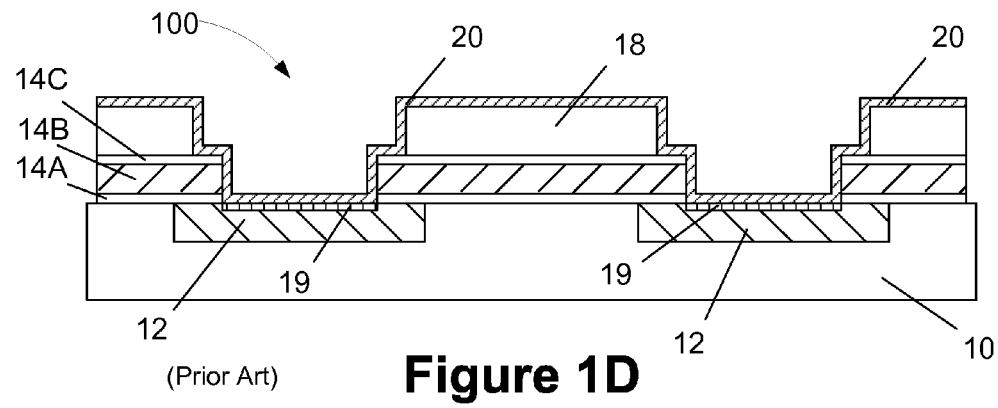
Figure 1E:
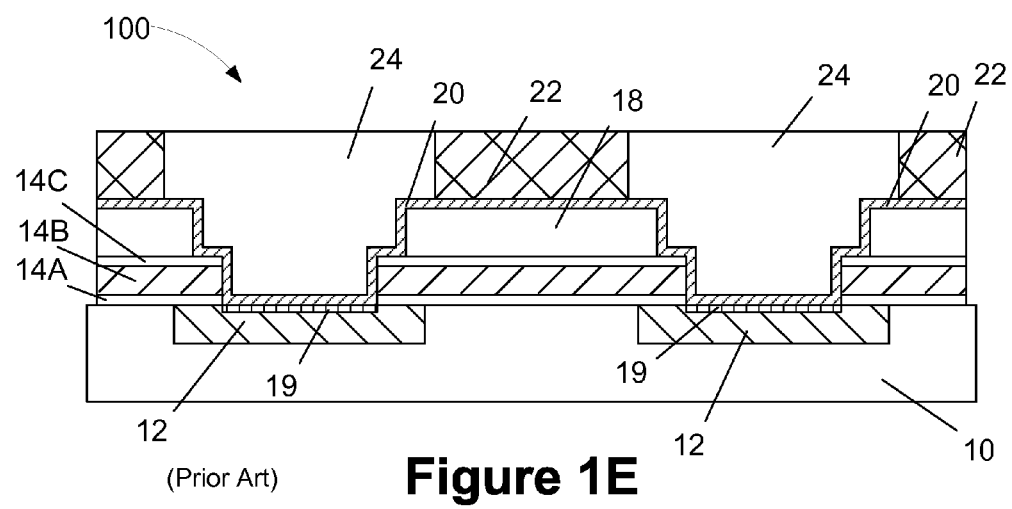
Figure 1F:
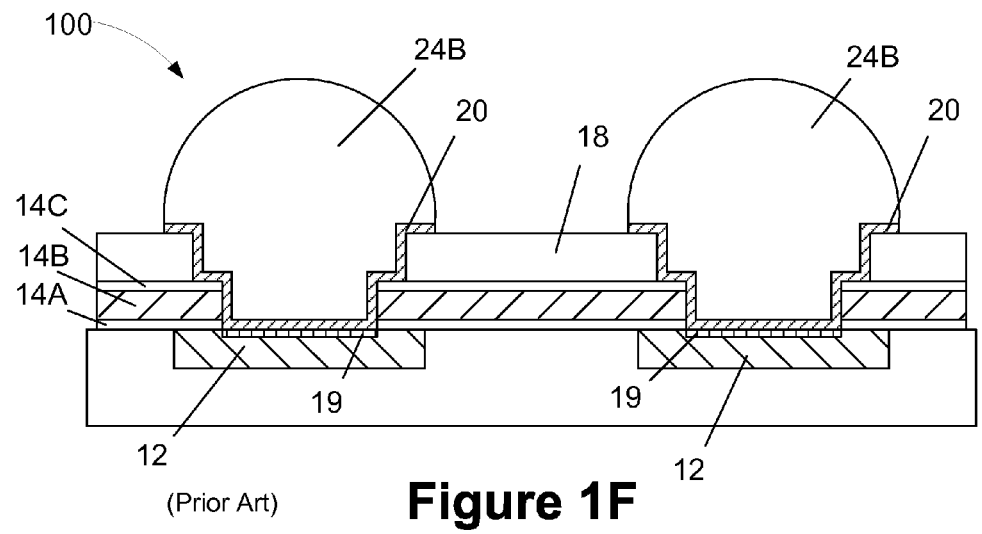

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming conductive bump structures on integrated circuit devices. As will be readily apparent to those skilled in the art upon a complete reading of the present application, the methods disclosed herein are appli-cable to a variety of devices, including, but not limited to, ASICs, logic devices, memory devices, etc. With reference to FIGS. 2A-2G and 3A-3G, various illustrative embodiments of the methods and devices disclosed herein will now be described in more detail. To the extent that the same reference numbers are used in both FIGS. 1A-1F and FIG. 2A-2G or 3A-3G, the previous description of those structures applies equally to FIGS. 2A-2G and 3A-3G.

Figure 2A:
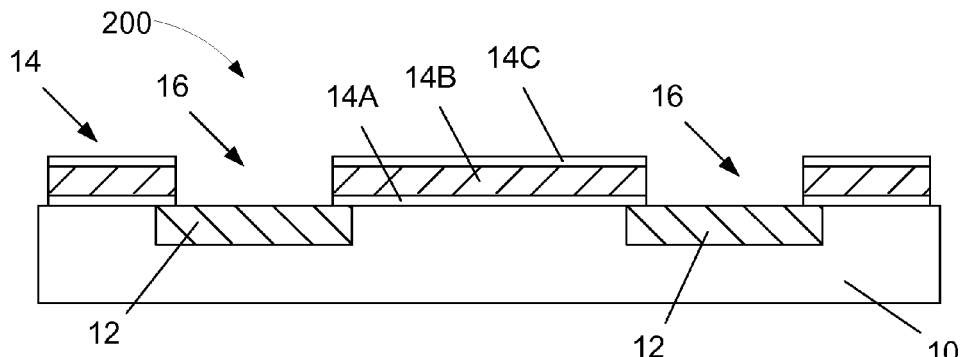
FIGS. 2A-2G depict one illustrative process flow disclosed herein for forming conductive bump structures on integrated circuit devices, wherein the bump structure includes a protective layer.

FIGS. 2A-2G depict one illustrative process flow disclosed herein for forming conductive bumps for a semiconductor device 200. FIG. 2A depicts the novel device 200 at an early stage of manufacture. As shown therein, a plurality of spaced-apart conductive pads 12 are formed in a layer of insulating material 10. The layer of insulating material 10 may be comprised of a variety of insulating materials, e.g., a low-k (k value less than 3) material, silicon dioxide, etc. The layer of insulating material 10 may be formed by performing a variety of known deposition processes, e.g., a CVD process. The conductive pads 12 may be comprised of a variety of materials, e.g., copper, a copper alloy, aluminum, an aluminum alloy, etc. The conductive pads 12 may have any desired configuration and they may be formed using traditional techniques. Also depicted in FIG. 2A is a patterned passivation layer 14 that is formed above the layer of insulating material 10. In general, the device 200 depicted in FIG. 2A corresponds to the device 100 depicted in FIG. 1B. In one illustrative example, the passivation layer 14 may be comprised of multiple layers of material. More specifically, in the depicted example, the passivation layer 14 may be comprised of a layer of silicon-carbon-nitride (BLOK) 14A having an illustrative thickness of about 100 nm, a layer of silicon dioxide 14B having an illustrative thickness of about 450 nm and a layer of silicon nitride having an illustrative thickness of about 400 nm. Additionally, in some cases the order of the layers 14A, 14B and 14C may be reversed, while in other cases the numbers of layers used to make-up a multi-layer passivation layer 14 may be more than 3, e.g., a 4 layer passivation layer 14 (BLoK/SiO$_2$/SiN/SiO$_2$). As will be recognized by those skilled in the art after a complete reading of the present application, the passivation layer 14 may be comprised of a variety of materials such as silicon dioxide, silicon nitride, TEOS, FTEOS, SiOF, etc., including combinations of such materials. The layers 14A, 14B and 14C may be formed using traditional deposition processes, such as CVD processes. As shown in FIG. 2A, a plurality of openings 16 are formed in the passivation layer 14 to thereby expose portions of the conductive pads 12. The openings 16 may be formed using traditional photolithography and etching processes. More specifically, one or more etching processes are performed through a patterned photoresist mask (not shown) to form the openings 16. The size of the openings 16 may vary depending upon the particular application.

Figure 2B:
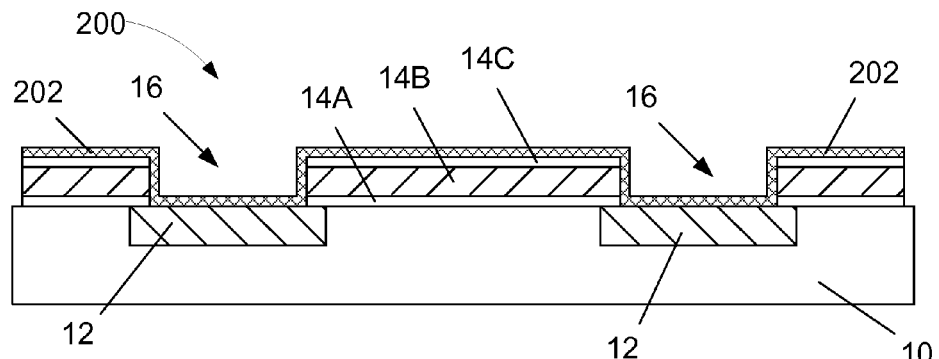

Next, as shown in FIG. 2B, a protective layer 202 is formed above the device 200 and particularly above the exposed portions of the conductive pads 12. In one illustrative example, the protective layer 202 may be comprised of silicon dioxide, silicon oxyfluoride (SiOF), silicon nitride, silicone carbon nitride (SiCN), etc., it may have a thickness of about 20-300 nm, and it may be formed by performing a variety of know deposition processes, e.g., CVD, atomic layer deposition (ALD), or plasma-enhanced versions of such processes.

Figure 2C:
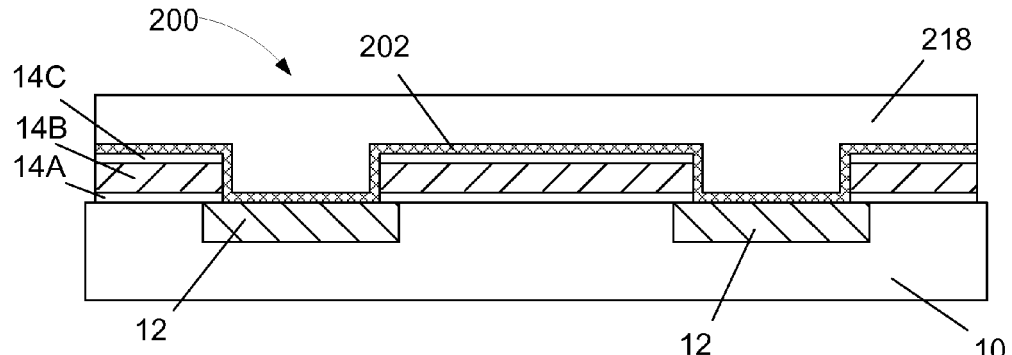

Then, as shown in FIG. 2C, a heat-curable material layer 218 is formed. The heat-curable material 218 may be comprised of a variety of materials, e.g., polyimide, polybenzoxadiaziole (PBO), etc. The heat-curable material layer 218 is typically formed by initially depositing the heat-curable material using a spin-coating technique, and thereafter performing a heating process at a temperature of, for example, about 360° C., to cure the heat-curable material layer 218. In some case, the heat-curable material layer 218 may have a thickness of about 2-10 microns. Among other things, the protective layer 202 acts to protect the underlying conductive pads 12 from the undesirable oxidation that occurred during the heating process that is performed to cure the polyimide layer 18 using the prior art process flow depicted in FIGS. 1A-1F.

Figure 2D:
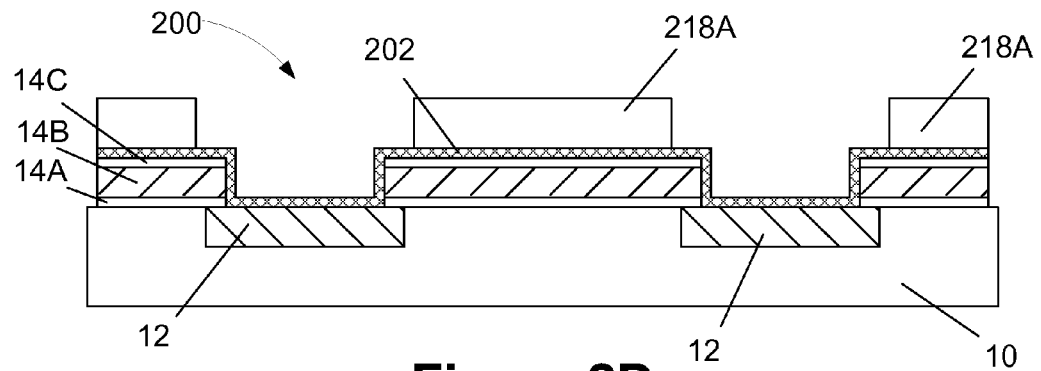

FIG. 2D depicts the device 200 after the heat-curable material layer 218 has been patterned using known photolithography and etching techniques. More specifically, one or more etching processes are performed through a patterned photoresist mask (not shown) formed above the heat-curable material layer 218 to form the patterned heat-curable material layer 218A depicted in FIG. 2D.

Figure 2E:
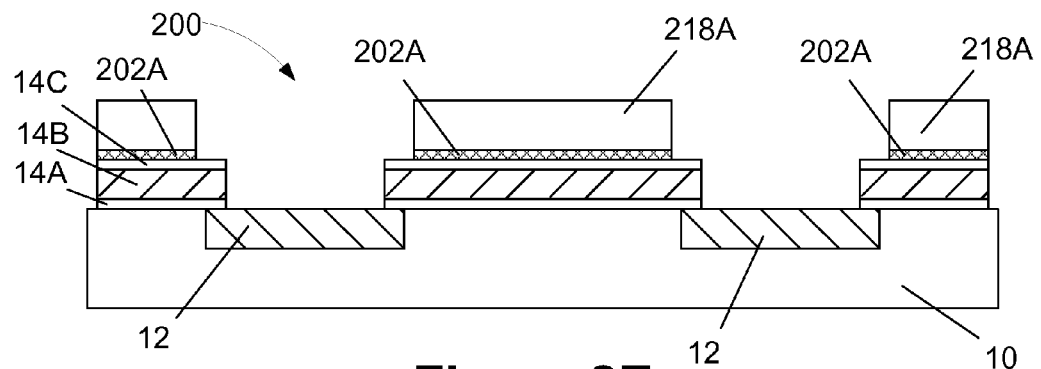

Next, as shown in FIG. 2E, an etching process is performed on the protective layer 202 through the patterned heat-curable material layer 218A to form the patterned protective layer 202A depicted in FIG. 2E. This etching process exposes portions of the conductive pads 12 for further processing.

Figure 2F:
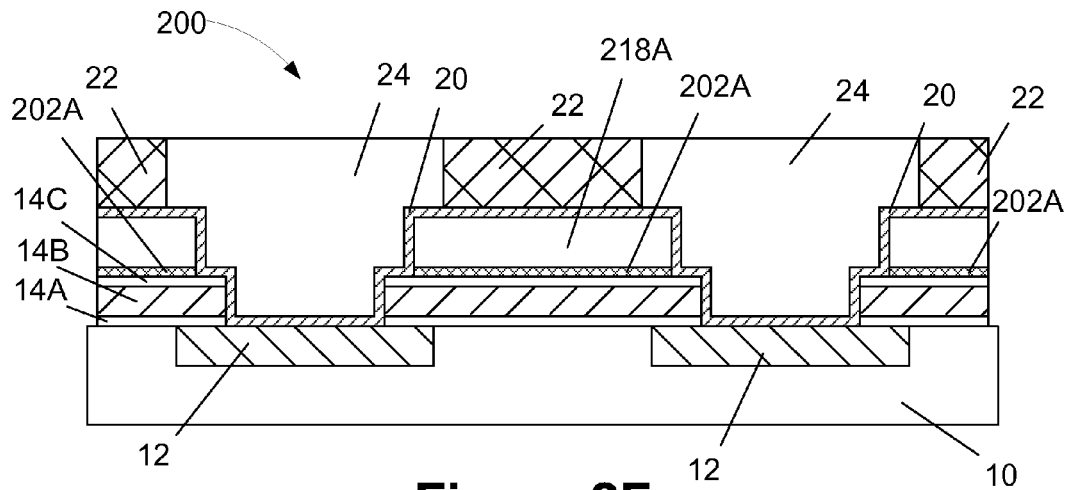

FIG. 2F depicts the device 200 after several process operations have been performed. First, an under-bump metallization (UBM) layer 20 is blanket-deposited across the device 200. The UBM layer 20 may be comprised of multiple layers of material and it may be formed by performing one or more deposition processes. In one example, the UBM layer 20 may be comprised of an initial layer of titanium (not shown) having a thickness of about 50-300 nm and a layer of copper (not shown) having a thickness of about 100-500 nm formed on the layer of titanium or a layer of titanium-tungsten. The UBM layer 20 may be formed by performing a variety of known techniques, e.g., by performing one or more physical vapor deposition (PVD) processes. Then, with continuing reference to FIG. 2F, a patterned mask layer 22, e.g., a photoresist mask, is formed above the device 200 and conductive material 24 for the conductive bump is formed on the device 200. In one illustrative example, a plating process is performed to form a layer of nickel (not shown) on the exposed portions of the device 200 followed by another plating process that forms the bulk of the conductive material 24. In one illustrative example, the conductive material 24 is comprised of tin-silver, but other materials, such as SnCu or SnAgCu, may also be used.

Figure 2G:
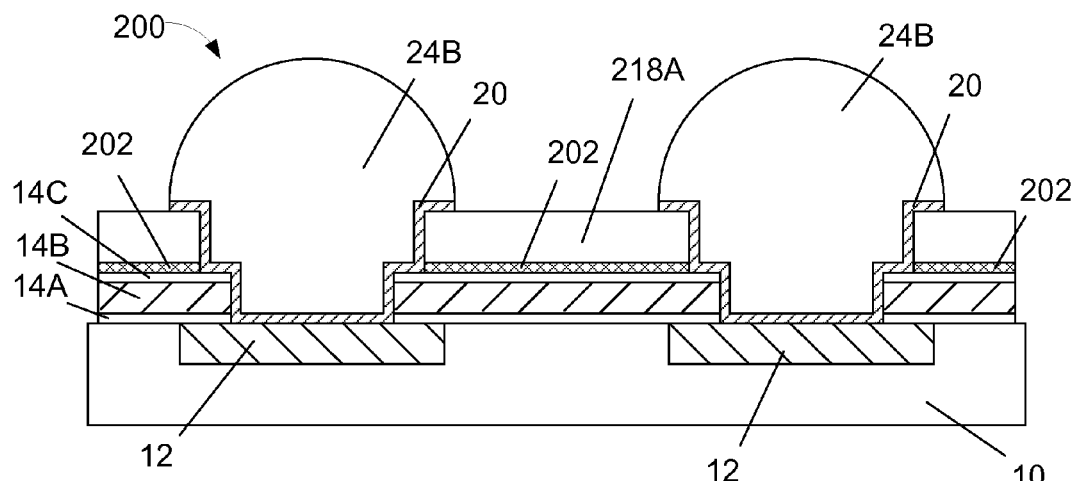

FIG. 2G depicts the device 200 after additional process operations have been performed. Initially, the patterned mask layer 22 (see FIG. 2F) is removed. Thereafter, a heating or reflow process is performed which results in the formation of the illustrative conductive bumps 24B shown in FIG. 2G.

As can be seen in FIG. 2G, the novel device 200 disclosed herein includes first and second spaced-apart conductive pads 12 positioned in a layer of insulating material 10, first and second spaced-apart under-bump metallization layers 20 that are conductively coupled to the first and second conductive pads 12, respectively, and first and second spaced-apart conductive bumps 24B, each of which are conductively coupled to the first and second under-bump metallization layers 20, respectively. In this example, the device 200 further includes a passivation layer positioned above the layer of insulating material 10 between the first and second spaced-apart conductive bumps 24B and a protective layer 302 positioned on the layer of insulating material 10, wherein the protective layer 302 extends between and contacts the first and second under-bump metallization layers 20.

Figure 3A:
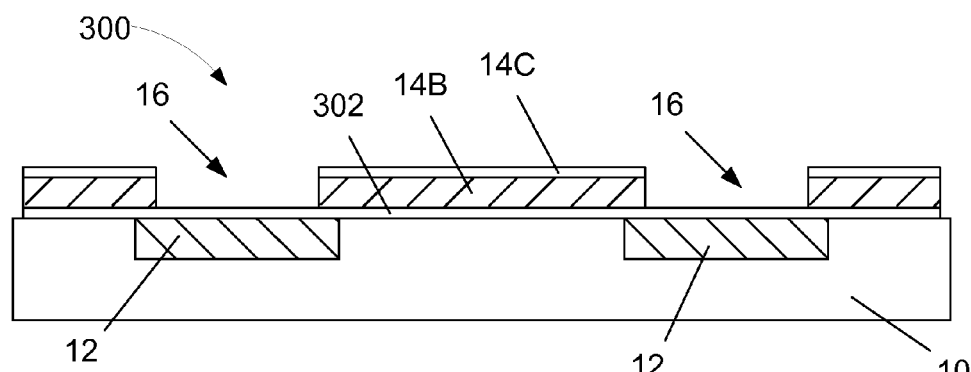
FIGS. 3A-3G depict another illustrative process flow disclosed herein for forming conductive bump structures on integrated circuit devices.

FIGS. 3A-3G depict another illustrative process flow disclosed herein for forming conductive bumps for a semiconductor device 300. FIG. 3A depicts the novel device 300 at an early stage of manufacture. As shown therein, a plurality of spaced-apart conductive pads 12 are formed in a layer of insulating material 10. Also depicted in FIG. 2A is a multi-layer passivation layer 14. In the depicted example, the multi-layer passivation layer 14 is comprised of a layer of silicon-carbon-nitride (BLOK) 302 having an illustrative thickness of about 100 nm that is formed on the layer of insulating material 10, a layer of silicon dioxide 14B having an illustrative thickness of about 450 nm that is formed on the layer 302 and a layer of silicon nitride 14C having an illustrative thickness of about 400 nm that is formed on the layer 14B. Alternative materials for the passivation layer 14 have been previously discussed. The layers 302, 14B and 14C may be formed using traditional deposition processes, such as CVD processes. In FIG. 3A, one or more etching processes have been performed on the passivation layer 14 thorough a patterned mask layer (not shown), e.g., a photoresist mask, to remove less than all of the material layers that make up the multi-layer passivation layer 14. These etching processes result in the formation of recesses 304 in the passivation layer 14 and expose portions of the layer 302, the layer in contact with the conductive pad 12 and the layer of insulating material 10.

Figure 3B:
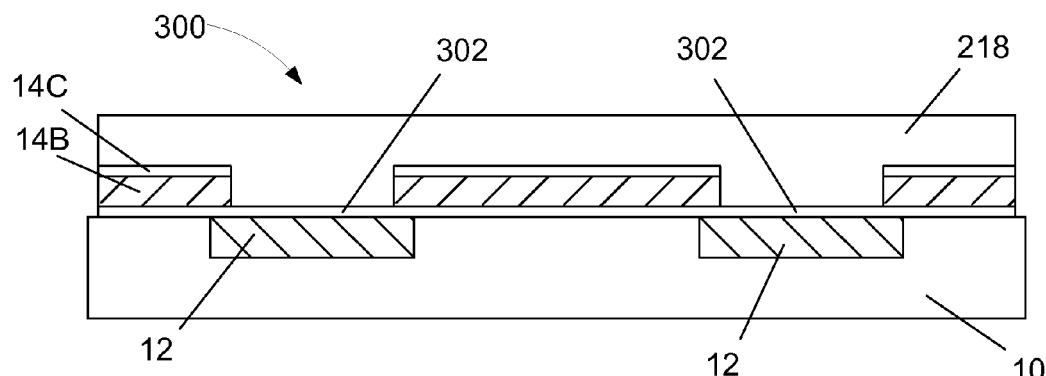

Then, as shown in FIG. 3B, the heat-curable material layer 218, as discussed above, is formed. Among other things, the first layer 302 acts to protect the underlying conductive pads 12 from the undesirable oxidation that occurred during the formation of the polyimide layer 18 using the prior art process flow depicted in FIGS. 1A-1F.

Figure 3C:
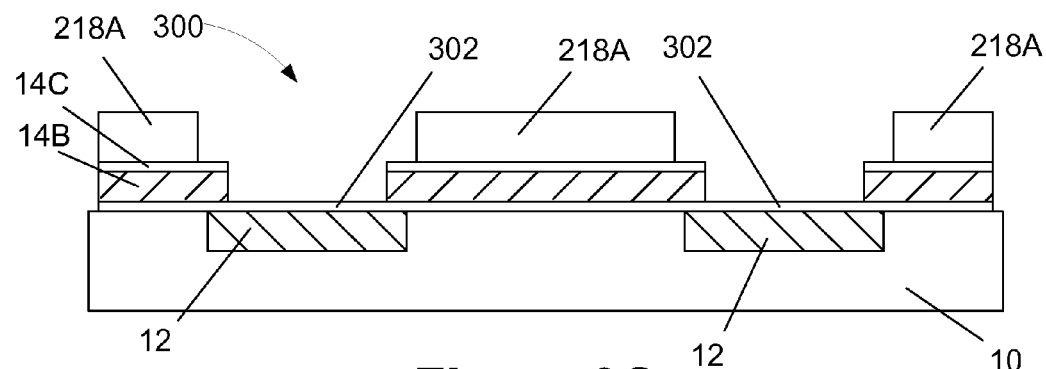

FIG. 3C depicts the device 300 after the heat-curable material layer 218 has been patterned using known photolithography and etching techniques. More specifically, one or more etching processes are performed through a patterned photoresist mask (not shown) formed above the heat-curable material layer 218 to form the patterned heat-curable material layer 218A depicted in FIG. 3C.

Figure 3D:
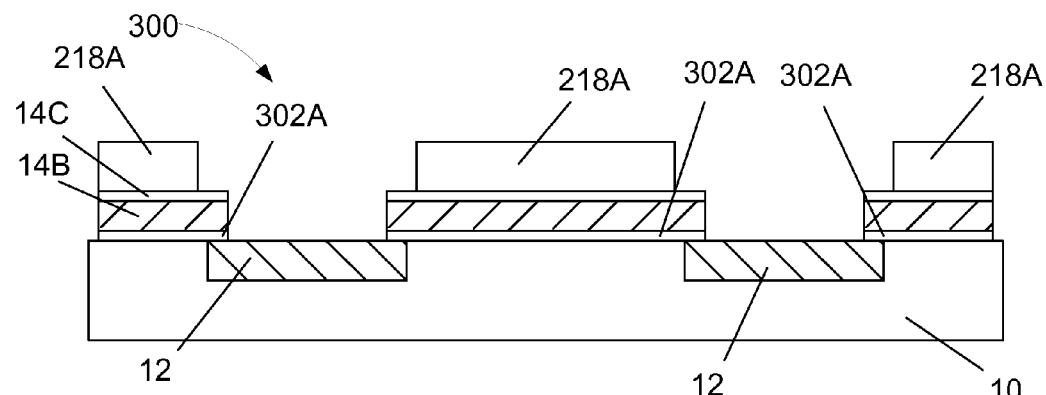

Next, as shown in FIG. 3D, an etching process is performed on the layer 302 through the patterned heat-curable material layer 218A to form the patterned layer 302A depicted in FIG. 3D. This etching process exposes the conductive pads 12 for further processing.

Figure 3E:
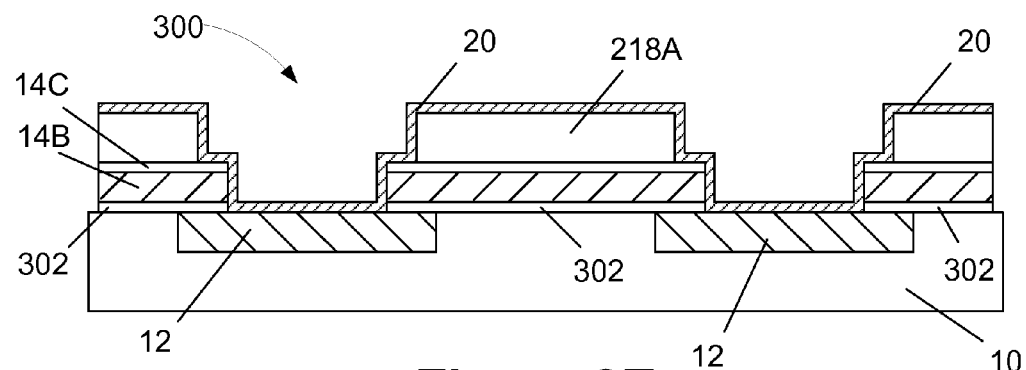

FIG. 3E depicts the device 300 after an under-bump metallization (UBM) layer 20 is blanket-deposited across the device 300. The UBM layer 20 may be comprised of multiple layers of material and it may be formed by performing one or more deposition processes. In one example, the UBM layer 20 may be comprised of an initial layer of titanium (not shown) having a thickness of about 50-300 nm and a layer of copper (not shown) having a thickness of about 100-500 nm formed on the layer of titanium or titanium-tungsten. The UBM layer 20 may be formed by performing a variety of known techniques, e.g., by performing one or more physical vapor deposition (PVD) processes.

Figure 3F:
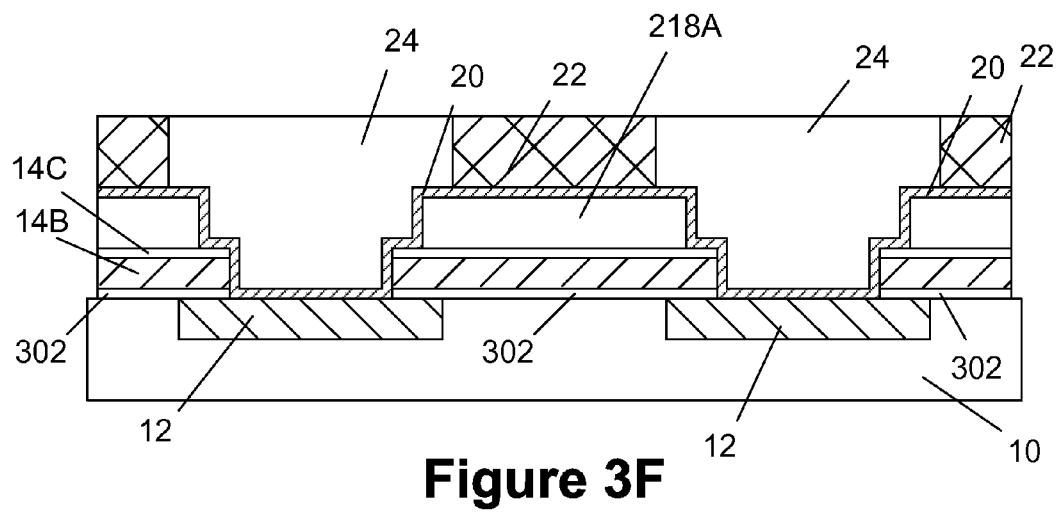

Then, as shown in FIG. 3F, a patterned mask layer 22, e.g., a photoresist mask, is formed above the device 300 and conductive material 24 for the conductive bump is formed on the device 300. In one illustrative example, a plating process is performed to form a layer of nickel (not shown) on the exposed portions of the device 300 followed by another plating process that forms the bulk of the conductive material 24. In one illustrative example, the conductive material 24 is comprised of tin-silver, but other materials, such as SnCu or SnAgCu, may also be used.

Figure 3G:
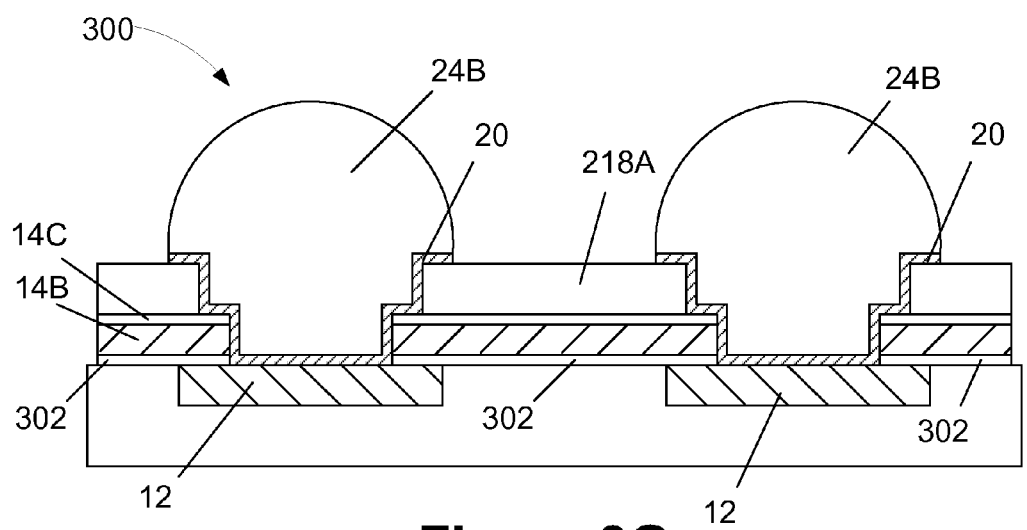

FIG. 3G depicts the device 300 after additional process operations have been performed. Initially, the patterned mask layer 22 (see FIG. 3F) is removed. Thereafter, a heating or reflow process is performed which results in the formation of the illustrative conductive bumps 24B shown in FIG. 3G.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a conductive pad in a layer of insulating material;
   forming a passivation layer above said conductive pad and said layer of insulating material;
   performing at least one etching process on said passivation layer to define an opening in said passivation layer that exposes at least a portion of said conductive pad;
   forming a protective layer comprising of one of silicon dioxide, silicon oxyfluoride (SiOF), silicon nitride (SiN), and silicone carbon nitride (SiCN) on said passivation layer, in said opening and on said exposed portion of said conductive pad;
   forming a heat-curable material layer above said protective layer;
   performing an etching process on said heat-curable material layer to define a patterned heat-curable material layer having an opening that exposes a portion of said protective layer;
   performing an etching process to remove said exposed portion of said protective layer to thereby expose at least a portion of said conductive pad; and
   after removing said exposed portion of said protective layer, forming a conductive bump that is conductively coupled to said conductive pad.

2. The method of claim 1, wherein forming said heat-curable material layer above said protective layer comprises depositing a heat-curable material for said heat-curable material layer and performing a heating process to cure said heat-curable material for said heat-curable material layer while said protective layer is positioned on said exposed portion of said conductive pad.

3. The method of claim 1, wherein forming said passivation layer above said conductive pad and said layer of insulating material comprises forming a multi-layer passivation layer above said conductive pad and said layer of insulating material.

4. The method of claim 3, wherein said multi-layer passivation layer is comprised of a first layer comprised of silicon, carbon and nitrogen formed on said layer of insulating material, a second layer comprised of silicon dioxide formed on said first layer and a third layer comprised of silicon nitride formed on said second layer.

5. The method of claim 1, wherein forming said conductive pad in said layer of insulating material comprises forming a conductive pad comprised of copper in said layer of insulating material.

6. The method of claim 1, wherein forming said conductive bump comprises forming a conductive bump comprised of tin and at least one of silver and copper.

7. The method of claim 1, wherein, prior to forming said conductive bump, forming an under bump metallization layer that contacts said conductive pad, said protection layer and said patterned heat-curable material layer.

8. The method of claim 1, wherein said protective layer has a thickness of 20-300 nm.

9. The method of claim 1, wherein said heat-curable material layer is comprised of one of polyimide and polybenzoxadiazole (PBO).

10. A method, comprising:
    forming a conductive pad in a layer of insulating material;
    forming a multi-layer passivation layer above said conductive pad and above said layer of insulating material, a first layer of said multi-layer passivation layer being in contact with said conductive pad and said layer of insulating material;

performing at least one etching process on said multi-layer passivation layer to remove at least one layer of said multi-layer passivation layer, said at least one etching process defining an etched passivation layer having a recess that exposes at least a portion of said first layer;

forming a heat-curable material layer above said etched passivation layer and said exposed portion of said first layer;

performing an etching process on said heat-curable material layer to define a patterned heat-curable material layer having an opening that exposes a portion of said etched passivation layer and said exposed portion of said first layer;

performing an etching process to remove said exposed portion of said first layer to thereby expose at least a portion of said conductive pad; and after removing said exposed portion of said first layer, forming a conductive bump that is conductively coupled to said conductive pad.

11. The method of claim 10, wherein forming said heat-curable material layer above said etched passivation layer and said exposed portion of said first layer comprises depositing heat-curable material for said heat-curable material layer and performing a heating process to cure said heat-curable material for said heat-curable material layer while said exposed portion of said first layer is positioned on said conductive pad.

12. The method of claim 10, wherein forming said multi-layer passivation layer comprises forming a first layer comprised of silicon, carbon and nitrogen on said layer of insulating material, forming a second layer comprised of silicon dioxide on said first layer and forming a third layer comprised of silicon nitride on said second layer.

13. The method of claim 10, wherein forming said conductive pad in said layer of insulating material comprises forming a conductive pad comprised of copper in said layer of insulating material.

14. The method of claim 10, wherein forming said conductive bump comprises forming a conductive bump comprised of tin and at least one of silver and copper.

15. The method of claim 10, wherein said heat-curable material layer is comprised of one of polyimide and polybenzoxadiaziole (PBO).

* * * * *